United States Patent [19]

Mitchell et al.

[11] Patent Number: 5,168,334

[45] Date of Patent: Dec. 1, 1992

[54] NON-VOLATILE SEMICONDUCTOR MEMORY

[75] Inventors: Allan T. Mitchell, Garland; Bert R. Riemenschneider, Murphy, both of Tex.

[73] Assignee: Texas Instruments, Incorporated, Dallas, Tex.

[21] Appl. No.: 641,803

[22] Filed: Jan. 16, 1991

Related U.S. Application Data

[63] Continuation of Ser. No. 534,315, Jun. 5, 1990, abandoned, which is a continuation of Ser. No. 344,427, Apr. 26, 1989, abandoned, which is a continuation of Ser. No. 80,036, Jul. 31, 1987, abandoned.

[51] Int. Cl.[5] .................... H01L 29/68; H01L 29/78; H01L 29/34
[52] U.S. Cl. .................... 257/324; 257/637; 257/640; 257/648
[58] Field of Search .................... 357/23.5, 54, 675

[56] References Cited

U.S. PATENT DOCUMENTS

| 4,360,900 | 11/1982 | Bate | 357/23.5 |
| 4,373,248 | 2/1983 | McElroy | |
| 4,377,818 | 3/1983 | Kuo et al. | 357/23.5 |
| 4,451,904 | 5/1984 | Sugiura et al. | 357/23.5 |
| 4,597,060 | 6/1986 | Mitchell et al. | |
| 4,768,080 | 8/1988 | Sato | 357/54 |
| 4,774,556 | 9/1988 | Fujii et al. | 357/23.4 |

FOREIGN PATENT DOCUMENTS

| 58-212180 | 12/1983 | Japan | 357/23.5 |
| 8100790 | 3/1981 | PCT Int'l Appl. | 357/23.5 |

OTHER PUBLICATIONS

A True Single-Transistor Oxide-Nitride-Oxide EEPROM Device, T. Y. Chan, K. K. Young, and Chenming Hu, IEEE Electron Device Letters, vol. EDL-8, No. 3, Mar. 1987.

Primary Examiner—Andrew J. James
Assistant Examiner—Ngan Van Ngo
Attorney, Agent, or Firm—Richard B. Havill; Leo N. Heiting; Richard L. Donaldson

[57] ABSTRACT

A small-area single-transistor EEPROM memory cell includes buried bit lines (44,46) extending through the array and connecting together many memory cells. Formed above a channel area (25) and between the bit lines (44,46) are oxide-nitride-oxide layers (50,52,54) for providing isolation between overlying polysilicon word lines (56, 66) and the underlying conduction channel (25). The nitride layer (52) provides the charge retention mechanism for programming the memory cell. The word lines (56, 66) provide electrical contact to a number of memory cells in the row. Electrical contact is made to the word lines (56, 66) by metal contacts (68, 70), and to the bit lines (44,46) by metal contacts (72, 74) at the array periphery, thereby avoiding metal contacts to every memory cell of the array. A EEPROM memory cell of 4-5.2 microns can be fabricated.

12 Claims, 4 Drawing Sheets

NON-VOLATILE SEMICONDUCTOR MEMORY

This application is a continuation of application Ser. No. 534,315, filed Jun. 5, 1990, which is a continuation of Ser. No. 344,427, filed Apr. 26, 1989, which is a continuation of Ser. No. 080,036, filed Jul. 31, 1987, all now abandoned.

TECHNICAL FIELD OF THE INVENTION

The present invention relates in general to semiconductor memories and methods of fabrication thereof, and more particular relates to electrically erasable read-only memories and methods of fabrication thereof.

BACKGROUND OF THE INVENTION

The development of electrically erasable programmable read-only memories (EEPROMs) has made possible a non-volatile memory which can be altered by electrically programming the device. A conventional requirement of prior types of read-only memories was a transparent window on the chip for exposing the memory cells to ultraviolet light for erasing the cell contents prior to reprogramming. With current read-only memories which are electrically erasable, both the erasing and programming can be accomplished employing electrical signals, thereby allowing the devices to remain connected in the circuit, as well as alleviating the need for ultraviolet light sources.

In an effort to reduce the wafer area of EEPROM memory cells so that more field effect transistor cells can be fabricated on a single integrated circuit chip, recent developments have reduced the memory cell from a four-transistor configuration to two transistors. In the two-transistor EEPROM cell arrangement, one field effect transistor provides the non-volatile storage mechanism for electrical charge, while the other transistor provides electrical isolation of the storage transistor from a bit line of the memory array. The isolation transistor is necessary as the storage transistor may be transformed into a depletion mode device during electrical erasing, thereby rendering it leaky or unable to be placed in a nonconductive state.

The two-transistor EEPROM cell has been further refined to integrate the storage and isolation functions into a single transistor cell, such transistor providing both functions. The technical article "A True Single-Transistor Oxide-Nitride-Oxide EEPROM Device", by T. Y. Chan, K. K. Young & C. Hu, Electronics Research Laboratory, Department of Electrical Engineering & Computer Sciences, University of California, Berkley, 1986, describes such an EEPROM cell.

While the EEPROM memory cell of the noted technical article enables further reduction of the cell area, and thus an integration of more cells on a chip, the disadvantage attendant with such a technique is that separate source and drain diffusions are required for each cell, as well as one or more metal contacts for gaining access to each cell by word and bit lines. Hence, in addition to requiring more complicated mask and fabrication steps, and the resulting yield and reliability problems, such a memory cell is suboptimal in terms of wafer area requirements.

From the foregoing, it can be seen that a need exists for a non-volatile EEPROM memory cell which employs a single transistor arrangement for electrically erasing and programming data therein, and which requires a smaller wafer area per cell than EEPROM devices heretofore known. An associated need exists for an EEPROM memory cell which is easily manufacturable, requires only a small wafer area, and can be fabricated utilizing presently known silicon fabrication techniques and facilities.

SUMMARY OF THE INVENTION

In accordance with the present invention, the disclosed EEPROM memory cell, and the method of fabrication thereof, substantially reduces or eliminates the disadvantages and shortcomings associated with the prior art techniques. A technical advantage of the EEPROM cell of the invention is that the wafer area required of a number of EEPROM memory cells is reduced by reducing the number of contacts for accessing the individual memory cells. An associated technical advantage presented by the invention is that a number of memory cells are connected in common to a word line, and connection to the word line is made at the periphery of the memory array, rather than to the word line throughout the array itself. Yet another technical advantage of the invention is that each cell of a number of cells is connected in common to bit lines, and electrical connection is also made to the bit lines near the periphery of the memory array. As a result of the foregoing, a resulting technical advantage presented by the invention allows an array of EEPROM cells to be fabricated in a smaller wafer area then heretofore realized.

According to the preferred form of the invention, the EEPROM array is constructed by forming a number of pairs of buried diffused areas defining bit lines common to a plurality of memory cells. Each diffused region forms a source and drain region of the individual single-transistor memory cells. The diffused bit lines are spaced apart to form a channel area, and oxide-nitride-oxide layers are formed over the channel area. The nitride layer provides the mechanism for retaining electrical charge in a concentrated area thereof so that the cell can be programmed to retain electrical information. Formed over a number of cells is a conductive word line which defines a gate conductor for controlling the isolation transistor part of the EEPROM cell.

Electrical contact is made to the word lines and bit lines by forming electrical connections thereto near the periphery of the array. In this manner, electrical contact need not be made within the array; neither to the bit line regions of the cells, nor the word lines.

In an alternate embodiment of the invention, the memory cells are fabricated employing a deposited oxide insulation for separating the EEPROM cells. The oxide is conformal in nature and is planarized to reduce the lateral area otherwise required for both thermally grown oxide and the out diffusion of the bit line diffused areas. The diffused bit lines can be silicided to further reduce the sheet resistance thereof, thereby eliminating the need for bit line contacts within the memory array. A memory cell thus fabricated requires about half the wafer area of EEPROM cells heretofore known.

BRIEF DESCRIPTION OF THE DRAWINGS

Further features and advantages will become more apparent from the following and more particular description of the preferred embodiment of the invention, as illustrated in the accompanying drawings in which like reference characters generally refer to the same parts, elements or regions throughout the views, and in which.

DETAILED DESCRIPTION OF THE INVENTION

Figure 1:
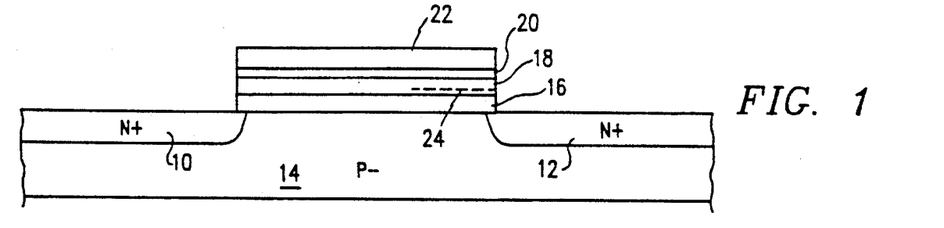
FIGS. 1-5 illustrate sectional views of an EPROM cell of the invention, taken during various process steps of the fabrication thereof.

FIG. 1 illustrates a one-transistor EEPROM cell, many of which are formed in an array of rows and columns to form a memory. The memory cell can be programmed by applying a set of voltages to the gate, source and drain terminals, and can be erased by applying another set of voltages thereto. The programming voltages are generally of magnitudes different from the voltages required for the standard read operations of the memory cell. The advantage of such a type of EEPROM is that it can be reprogrammed in the circuit without requiring the time consuming process of ultraviolet erasing.

The EEPROM cell of FIG. 1 includes a pair of spaced-apart heavily doped N-type semiconductor regions 10 and 12 forming the respective source and drain regions of the memory cell. A lightly doped P-type semiconductor region 14 defines the channel region of the cell transistor which is disposed between the source and drain regions 10 and 12. Formed above the channel region 14 is a triple layer of silicon oxide 16, silicon nitride 18 and silicon oxide 20. The lower silicon oxide layer 16 is very thin, about 60 angstroms, and forms an electrical isolation over the channel region 14. Formed above the lower oxide layer 16 is the silicon nitride layer 18 which provides the mechanism for trapping electrical charge therein and forming the memory element of the cell. The silicon nitride layer 18 can be formed with a thickness in the neighborhood of about 200 angstroms. Formed over the silicon nitride layer 18 is a top silicon oxide layer 20. The silicon oxide layer 20 may be formed with a thickness of about 60-100 angstroms. The top silicon oxide layer 20 functions to electrically isolate a conductive gate conductor 22 from the underlying silicon nitride layer 18. The gate conductor 22 may be constructed utilizing doped polycrystalline silicon, sometimes referred to as polysilicon.

In operation, when a voltage of about nine volts is applied to the semiconductor drain region 12, zero volts is applied to the semiconductor source region 10, and when a voltage of about 10 volts is applied to the gate conductor 22, free electrons formed in the area of the drain 12 are attracted toward the more positive potential of the gate conductor 22, and are collected in the nitride layer, as shown by reference character 24. The electrons are concentrated in the nitride layer 18 in an area proximate to the drain region 12.

According to the hot electron injection phenomenon, the free electrons penetrate through the lower thin silicon oxide 16 and are collected in the nitride layer 18. The nitride provides an excellent mechanism by which the concentrated charge 24 does not permeate throughout the nitride layer 18, but rather remains concentrated in the area adjacent the drain 12. With such a concentrated charge 24, the threshold of that part of the memory cell transistor is raised above the other part of the channel region where there is no collected charge in the nitride layer, such as that shown in the left-hand part thereof. In practice, the threshold difference is significant, namely, seven volts where there is collected charge, and 0.7-1.0 volt where there is no concentrated charge.

Once programmed to concentrate the charge 24 in a concentrated area of the silicon nitride layer 18, the raised threshold of the cell does not permit the transistor to be placed into a conductive state during read operations of the cell. Hence, when the cell is programmed, as described, the transistor cannot conduct and a high impedance exists between the source region 10 and the drain region 12 when a read voltage is applied to the gate conductor 22. If the memory cell of FIG. 1 were not programmed, a read voltage applied to the gate conductor would overcome the 0.7-1.0 volt cell transistor threshold, whereupon the channel region 14 would become inverted and a low impedance would exist between the semiconductor source region 10 and the semiconductor drain region 12.

The EEPROM memory cell can be electrically erased by applying the proper voltage to the gate conductor 22 and the semiconductor drain region 12 to draw the concentrated charge 24 out of the silicon nitride layer 18. While it would be optimally desirable to draw only as much charge out of the silicon nitride layer 18 as was initially collected therein during programming, such a procedure is impractical. As a consequence, during many electrical erasing operations, too much charge is drawn out of the silicon nitride layer, whereupon that part of the channel region exhibits depletion mode characteristics. As a result, such part of the transistor tends to be in a normally conductive state and thereby produces a leakage impedance between the semiconductor source region 10 and the semiconductor drain region 12. However, that part of the channel region on the left-hand side thereof, does not exhibit depletion mode characteristics, and thereby allows the overall transistor cell to be turned off.

It can be appreciated that the EEPROM memory cell of FIG. 1 comprises essentially a single transistor, but having dual functions, as do the two-transistor EEPROM cells heretofore known. With a single transistor EEPROM memory cell, the overall area required for an array of such cells is very small. In addition, the fabrication of such an array is simplified.

The EEPROM memory of the invention provides a further improvement in that even smaller arrays can be fabricated, thereby facilitating the fabrication of a larger number of cells within a chip. Indeed, the memory cell of FIG. 1 is further improved according to the invention over practices previously implemented wherein separate semiconductor source regions and semiconductor drain regions are associated with each memory cell, and metal contact is made to each such semiconductor region.

The EEPROM memory cell and array constructed in accordance with a preferred embodiment thereof is illustrated in FIGS. 2-6. While a typical EEPROM memory incorporates additional circuits in the nature of row and address decoders, sense amplifiers, input/output circuits, etc., such additional circuits are well known in the art and may be easily implemented by those skilled in the art with the memory array of the invention.

Figure 2:
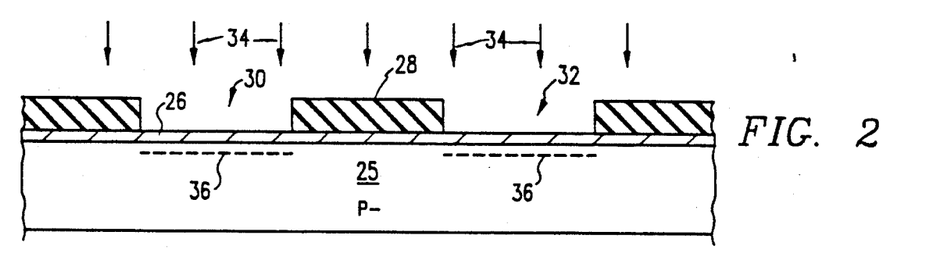

A semiconductor material suitable for commencing fabrication of the EEPROM memory array may be a 12-15 ohm-cm P-type silicon substrate 25, of a <100> crystal lattice orientation. A thin layer of silicon oxide 26 is thermally grown over the surface of the silicon substrate 25, to a depth of 350 angstroms. Such an oxide provides a layer of material so that a subsequent layer of photoresist 28 spun thereover does not contact the silicon material 25. The photoresist 28 is patterned to form source and drain openings 30 and 32 for defining elongated bit lines of the memory array. The wafer is next implanted with arsenic, or other N-type impurity, to counter-dope the P-type silicon layer 25 to heavily doped N-type areas, as noted by reference characters 36. The photoresist is then stripped from the surface of the wafer.

Figure 3:
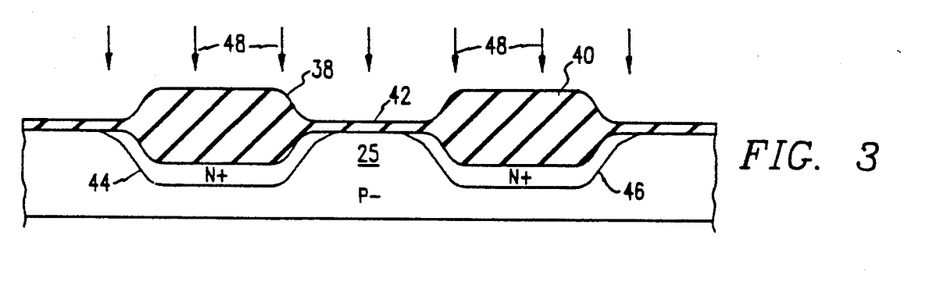

The wafer is then subjected to an oxidizing environment, in which the surface of the silicon layer 25 is differentially oxidized. By this, it is meant that a silicon oxide is formed with depths proportional to the doping level of the silicon material. Hence, the heavily doped regions of implanted arsenic 36 produce substantially thicker silicon oxide than the lightly doped P-type silicon material 25. FIG. 3 illustrates the thick field oxide regions 38 and 40 which are grown as a result of the consumption of a top portion of the heavily doped arsenic regions 36, whereas the oxide layer 42 overlying the lightly doped silicon layer 25 is much thinner. Also, the elevated temperature to which the wafer is exposed during the silicon oxide growth process drives the arsenic ions deeper into the silicon layer 25. The arsenic impurity also experiences a lateral outdiffusion when subjected to elevated temperatures. The arsenic implant is thereby activated for forming the elongate source and drain region bit lines 44 and 46. Such regions are common to other EEPROM memory cells defining a column of cells in the array. A blanket implant 48 may next be conducted over the surface of the wafer to establish a desired threshold of each of the cell transistors. In the preferred form of the invention, such threshold is set to about 0.7-1.0 volts.

Figure 4:
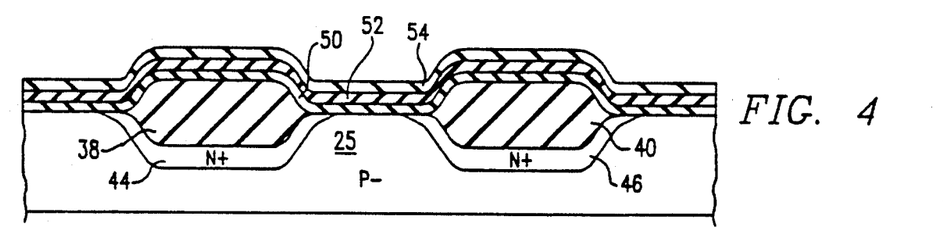

The wafer is then cleaned in a 10% hydrofluoric solution for stripping the thin oxide 42 from between the thicker oxide regions 38 and 40. As depicted in FIG. 4, a thin layer 50 of silicon oxide is thermally grown over the surface of the wafer, and then an overlying layer 52 of silicon nitride is deposited over layer 50, employing conventional LPCVD processes. In the preferred form, the silicon oxide layer 50 is thermally grown to a depth of about 60 angstroms, while the silicon nitride layer 52 is deposited to a depth of about 200 angstroms. The silicon oxide layer 50 functions as an electrical isolation between the silicon nitride layer 52 and the cell transistor channel region 14 located between the source region 44 and the drain region 46.

Figure 5:
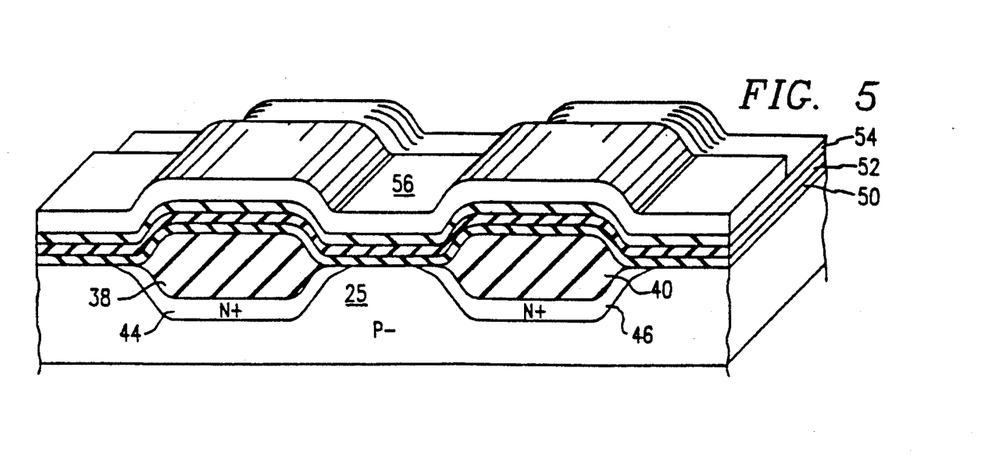

Next, the wafer is steam-sealed by growing a thin layer 54 of silicon oxide over the silicon nitride layer 52. The upper silicon oxide layer 54 is grown to a thickness of about 60 angstroms. A word line 56 is next formed over the channel area of the memory cell by depositing a layer of doped polysilicon over the wafer, and patterning the same to form a strip of polysilicon overlying the channel area of a number of memory cells, defining rows of the array. FIG. 5 illustrates one word line 56 which functions as a gate conductor for the illustrated EEPROM transistor cell.

Figure 6:
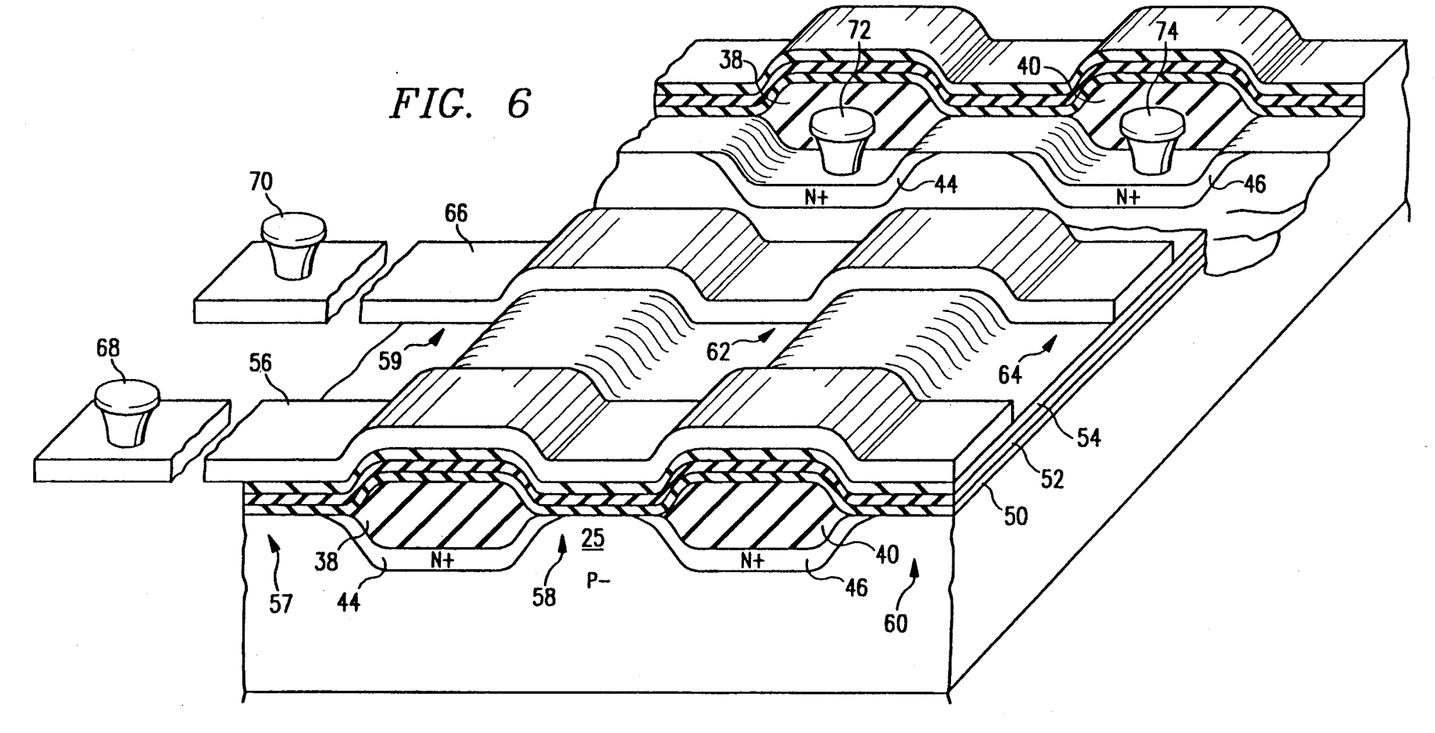
FIG. 6 is a sectioned isometric view of four EEPROM cells constructed in accordance with the preferred embodiment of the invention.

FIG. 6 is oblique view of the EEPROM array of the invention, sectioned to illustrate six memory cells 57, 58, 59, 60, 62 and 64. As can be seen, word line 56 is common to memory cells 57, 58 and 60, while word line 66 is common to memory cells 59, 62 and 64. The bit lines 44 and 46 are formed generally orthogonal to the word lines 56 and 66 of the array. Bit line 44 is common to memory cells 57, 58, 59 and 62, while bit line 46 is common to memory cells 58, 60, 62 and 64. With such an arrangement of word lines and bit lines, the rows and columns of the memory array can be addressed so as to individually program, erase or read each memory cell.

Formed at the ends of each of the word lines 56 and 66, as well as the other word lines or the array, are associated contacts 68 and 70 for connecting such word lines to the memory row address decoders and driven circuitry. With this arrangement, no contacts need be made within the central part of the array, thereby allowing the memory cells to be formed dimensionally as small as allowed by current photolithographic techniques.

In accordance with another feature of the invention, the source and drain regions 44 and 46 of the illustrated memory cell are shared by many other cells in the columns. For example, the semiconductor diffused bit region 44 is shared by memory cells 58 and 62, while semiconductor diffused bit region 46 is shared by memory cells 60 and 64. As noted in FIG. 6, openings may be made in the wafer to expose the buried bit line diffusions 44 and 46, and respective metal contacts 72 and 74 formed in electrical contact therewith. Column address access to the other buried bit lines of the memory array can be made in a comparable manner. Depending on the resistivity of the bit lines of the array, additional contacts may be required. For example, with a typical bit line sheet resistance of 30 ohms/square, one contact for every 16 bits is common. This, however, is far less contacts than is needed in the prior art industry standard cell which require one contact for every 2 bits.

By employing the foregoing technique, an EEPROM memory cell can be fabricated using about 5.2 square microns, utilizing 1.0 micron lithography design rules. This represents less than half the area required of other EEPROM memory cells employing connections at the memory cell sites. The EEPROM array according to this embodiment may be constructed employing other modifications or enhancements as noted in U.S. Pat. No. 4,373,248, the disclosure of which is incorporated herein by reference.

FIGS. 7-11 illustrate another embodiment of the invention. In this embodiment, the EEPROM memory cell requires even less wafer area, as no thick field oxide growth is required, nor is the out diffusion of semiconductor bit lines of concern. In addition, in this embodiment, the bit line sheet resistance is reduced, thus removing the need for bit line contacts within the array. Such considerations require additional lateral wafer area and thereby place constraints on the area allocated for each memory cell.

Figure 7:
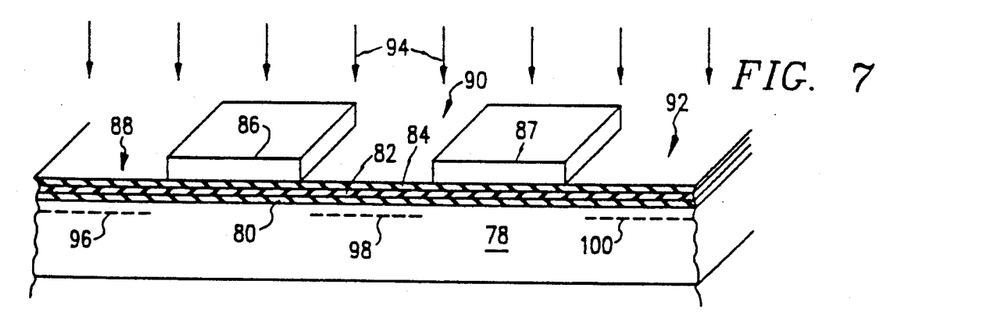
FIGS. 7-10 are sectional views of a small-area EEPROM cell constructed according to a planarized process.

With regard to FIG. 7, the P-type silicon substrate layer 78 has formed thereon the thermally grown layer of silicon oxide 80 and LPCVD silicon nitride layer 82. The wafer is steam-sealed to form the upper silicon oxide layer 84. The thicknesses of such layers may be formed to the depths noted above. Next, a doped layer of polysilicon is deposited over the wafer to a depth of about 4,000 angstroms. The polysilicon layer is patterned to form conductive blocks 86 and 87, with openings 88, 90 and 92 thenbetween.

A heavy dosage of arsenic is then implanted 94 into the wafer forming heavily doped N-type areas 96, 98 and 100. The patterned polysilicon conductive blocks 86 and 87 are used for connecting to conductive word lines which are common to other similar memory cells in the rows. Also, the patterned polysilicon blocks 86 and 87 function as masks to prevent the arsenic implant from reaching the underlying areas of the P-type layer 78. The wafer is then subjected to an etch for removing the oxide-nitride-oxide layers 80-84 which are not covered by the polysilicon connecting blocks 86 and 87. With this technique, the remaining oxide-nitride-oxide layers are self-aligned with respect to the side edges of the overlying polysilicon connecting blocks 86 and 87. At this point, standard techniques can be used to silicide the bit line areas 96, 98 and 100, thereby reducing the bit line sheet resistance from the typical 30 ohms/square to on the order of only one ohm/square. Such a reduction in bit line sheet resistance totally removes the need for bit line contacts within the array area. Steps for silicidng the bit lines are not shown in order to simplify the discussion.

Figure 8:
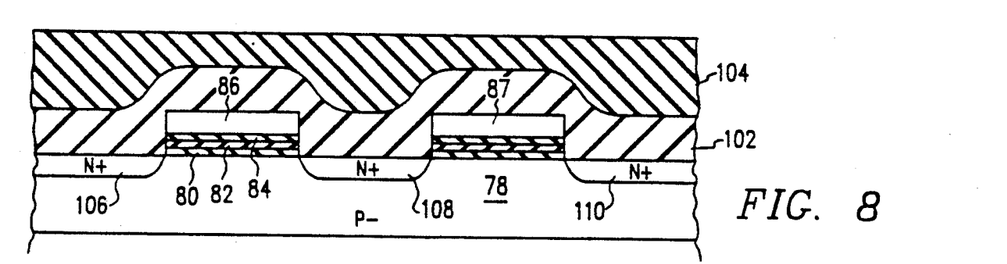

With reference now to FIG. 8, a thick layer 102 of conformal silicon oxide is deposited over the surface of the wafer, to a depth of about 5,000 angstroms. A conformal silicon oxide is especially advantageous for use as the deposited layer 102. A conformal silicon oxide, such as tetra-ethoxysilane (TEOS) is suitable for the deposition oxide layer 102. A layer of photoresist 104 is then spun over the surface of the wafer for filling the contoured surface of the conformal silicon oxide layer 102, and for providing a flat top surface. An etching process is then employed for etching the photoresist 104 and the conformal silicon oxide layer 102 at the same rate. When such an etch is conducted, the removal of material proceeds uniformally downwardly, until the polysilicon connecting blocks 86 and 87 are reached. The result is a planarized surface of the memory array. The wafer may be heated to a temperature effective to anneal the implant and activate the impurities to form diffused regions 106, 108 and 110. The diffused bit line regions 106-110 are elongate and are associated with other cells in the columns of the memory array.

Figure 9:
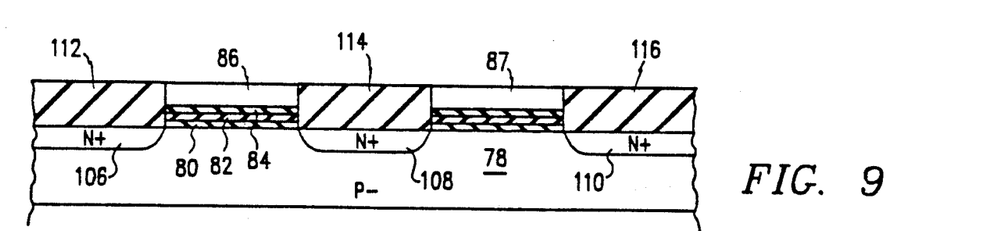

FIG. 9 illustrates the wafer of the alternative embodiment of the invention, after the planarizing etch, as described above. As noted, the top surface of the polysilicon connecting blocks 86 and 87 are planarized with respect to the top surface of the conformal silicon oxide 102, forming isolated oxide areas 112, 114 and 116.

Figure 10:
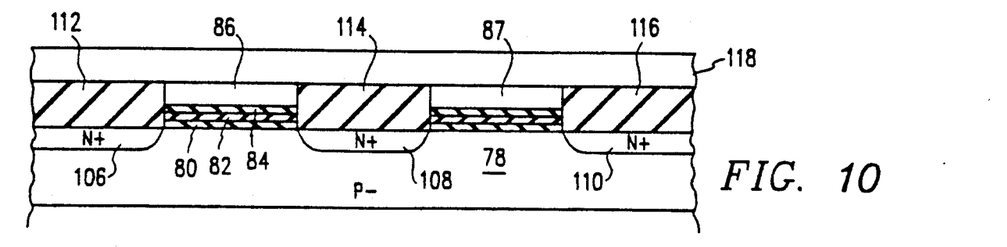

With reference now to FIG. 10, a second layer 118 of doped polysilicon is deposited over the surface of the wafer and patterned to define a word line extending in common with a number of other memory cells of the row. Importantly, the polysilicon word line 118 is in electrically contact with the first polysilicon layer forming the conductive connecting blocks 86 and 87. Thus, when an address signal is applied to the word line 118, such signal is applied simultaneously to the polysilicon connecting blocks 86 and 87 which function as gate conductors. All memory cells connected to the word line 118 which are not programmed with a concentrated charge on the silicon nitride layer 82 will conduct and present a low impedance between the associated pair of bit lines. Those memory cells in the row which are programmed so as to have a concentrated charge on the silicon nitride layer 82 will not be made conductive and thus will present a high impedance between the associated bit lines.

The advantage presented by the embodiment of FIG. 10 is that no thick silicon oxide need be grown to electrically isolate adjacent memory cells. By eliminating the thick thermally grown silicon oxide, the associated "bird's beak" does not form around the edges of the oxide, thereby requiring additional lateral wafer area. In addition, the high temperatures required for growing the thick silicon oxide is not required, and thus lateral out diffusion of impurity regions, such as the diffused bit lines, does not occur. Also, since the bit lines can be silicided using prior art techniques, the need for contacts within the array area is removed. Utilizing the photolithography design rules set forth above, a memory cell fabricated according to the planarized process would require only about four square microns of wafer area. With such a cell area, it is possible to fabricate a four megabit EEPROM memory chip.

Figure 11:
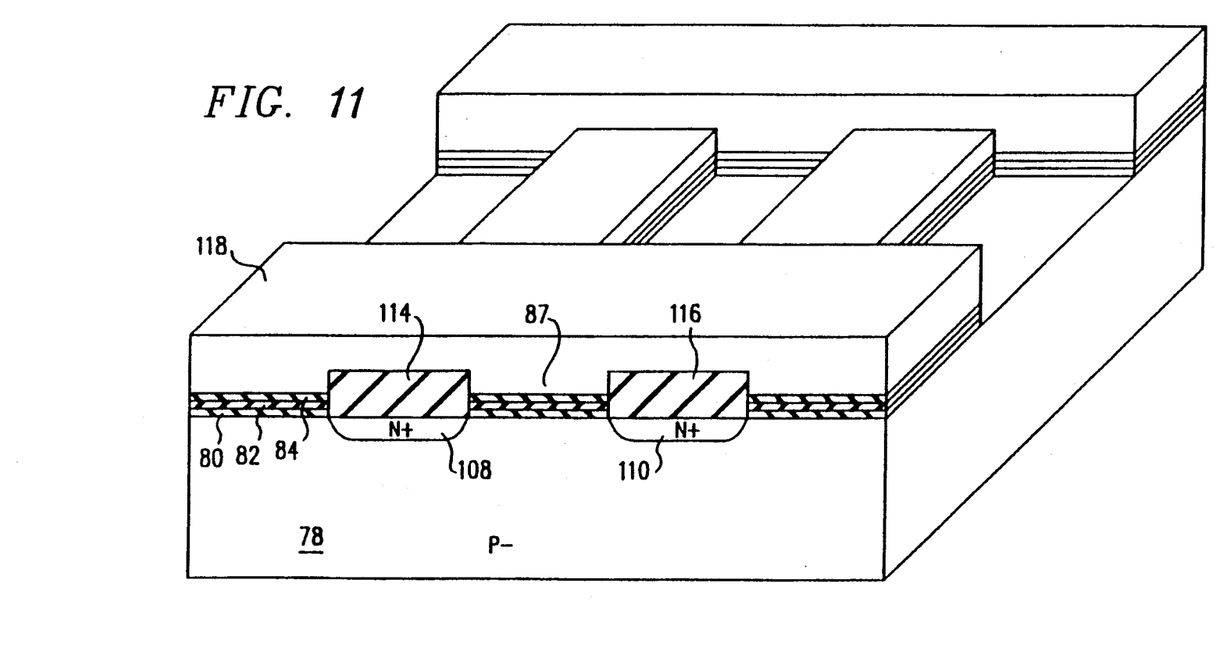
FIG. 11 is a sectioned isometric view of four adjacent cells of the EEPROM array of an alternate embodiment of the invention.

FIG. 11 illustrates a sectioned portion of an EEPROM array of the invention, illustrating four memory cells constructed in accordance with the alternate embodiment of the invention. Significantly, because the word lines and bit lines are coupled to plural respective memory cells, and because such word lines and bit lines extend throughout the memory array, no contacts need be made to each and every memory cell. Thus, in addition to providing a smaller memory cell due to the described planarized process, the cell area can be even further reduced in size because each cell does not require associated contacts. Contacts can be made to the word lines and bit lines in a manner much like that described above in connection with FIG. 6. The EEPROM array according to this embodiment may be constructed employing other modifications or enhancements as noted in U.S. Pat. No. 4,597,060, the disclosure of which is incorporated herein by reference.

From the foregoing, an EEPROM cell has been disclosed which is smaller in area than EEPROM cells heretofore known. Buried diffused bit lines are employed to connect a number of memory cells together for accessing such cells by one or a very few number of contacts which may be formed at the periphery of the array. In like manner, a number of word lines are formed throughout the array connecting rows of cells together for accessing such cells by one or a few contacts connecting the word lines at the periphery of the array. With this arrangement, very few electrical contacts are required, and thus the geometry of each memory cell can be reduced to accommodate a larger number of cells per wafer area.

While the invention has been described with reference to various illustrative embodiments, the description is not intended to be construed in a limiting sense. Various modifications of the illustrative embodiments, as well as other embodiments of the invention, will be apparent to those persons skilled in the art upon reference to this description. It is therefore contemplated that the appended claims will cover any such modifications or embodiments as may fall within the true scope of the invention.

What is claimed is:

1. An electrically programmable read-only memory device having an array of single transistor memory cells wherein each of said cells is read, programmed, and erased through a pair of associated bit lines and a single associated word line, the memory device comprising:

a semiconductor substrate;

each memory cell including:

a pair of bit lines extending in a first direction across said substrate, said pair of bit lines comprising doped conductive regions of said substrate;

a pair of thick insulating layers overlaying and covering only said pair of bit lines, the portion of the surface of said substrate lying between said pair of thick insulating layers defined as the channel region of a single transistor;

a charge trapping layer formed on said channel regions and said thick insulating layers for a plurality of memory cells, said charge trapping layer being substantially thinner above said substrate than said thick insulating layer is above said substrate, said charge trapping layer comprising a thin silicon nitride layer sandwiched between two thin layers of silicon oxide; and a plurality of straight parallel edge word lines extending across said substrate in a second direction and crossing over said bit lines and transistor channel regions, each of said word lines having both edges straight and parallel and being separated from said substrate by said charge trapping layer and said thick insulating layer above said bit lines and being separated from said transistor channel regions by said charge trapping layer, said plurality of word lines comprising a conductive material.

2. The device of claim 1 wherein each of said plurality of word lines is comprised of polycrystalline silicon.

3. The device of claim 1 wherein each of said plurality of word lines is comprised of a metal.

4. An electrically programmable read-only memory device having an array of single transistor memory cells wherein each of said cells is read, programmed, and erased through a pair of associated bit lines and a single associated word line, the memory device comprising:

a semiconductor substrate;

each memory cell including:

a pair of bit lines extending in a first direction across said substrate, said pair of bit lines comprising doped conductive regions of said substrate;

a pair of thick insulating layers overlaying and covering only said pair of bit lines, the portion of the surface of said substrate lying between said pair of thick insulating layers defined as the channel region of a single transistor;

a charge trapping layer formed on said channel regions and said thick insulating layers for a plurality of memory cells, said charge trapping layer being substantially thinner above said substrate than said thick insulating layer, said charge trapping layer comprising a thin silicon nitride layer sandwiched between two thin layers of silicon oxide; and a plurality of word lines extending across said substrate in a second direction and crossing over said bit lines, each of said word lines being separated from said substrate by said charge trapping layer and said thick insulating layer above said bit lines and being separated from said transistor channel regions by said charge trapping layer, said plurality of word lines comprising a conductive material.

5. The device of claim 4 wherein each of said plurality of word lines is comprised of polycrystalline silicon.

6. The device of claim 4 wherein each of said plurality of word lines is comprised of a metal.

7. An electrically programmable read-only memory device having an array of single transistor memory cells wherein each of said cells is read, programmed, and erased through a pair of bit lines and a single word line, the memory device comprising:

a semiconductor substrate;

each memory cell including:

a pair of associated bit lines extending in a first direction across said substrate, said pair of associated bit lines comprising doped conductive regions of said substrate;

a pair of thick insulating layers overlaying and covering only said pair of associated bit lines, the portion of the surface of said substrate lying between said pair of thick insulating layers defined as the channel region of a single transistor;

a charge trapping layer formed on said channel regions and said thick insulating layers for a plurality of memory cells, said charge trapping layer being substantially thinner above said substrate than said thick insulating layer is above said substrate, said charge trapping layer comprising a thin silicon nitride layer sandwiched between two thin layers of silicon oxide;

a plurality of straight parallel edge word lines extending across said substrate in a second direction and crossing over said associated bit lines and transistor channel regions, each of said word lines having both edges straight and parallel and being separated from said substrate by said charge trapping layer and said thick insulating layer above said associated bit lines and being separated from said transistor channel regions by said charge trapping layer, said plurality of word lines comprising a conductive material; and the pair of associated bit lines and the single word line for each of the memory cells are arranged to receive a set of potentials for creating in the channel region, near one of the associated bit lines, free electrons that are attracted toward and are collected within the silicon nitride layer only near the one of the associated bit lines.

8. An electrically programmable read-only memory device, in accordance with claim 7, wherein the pair of associated bit lines and the single word line for each of the memory cells are arranged to receive a set of potentials for drawing the collected free electrons out of the silicon nitride layer near the one of the associated bit lines to recombine in the channel region.

9. An electrically programmable read-only memory device having an array of single transistor memory cells wherein each of said cells is read, programmed, and erased through a pair of bit lines and a single word line, the memory device comprising:

a semiconductor substrate;

each memory cell including:

a pair of associated bit lines extending in a first direction across said substrate, said pair of associated bit lines comprising doped conductive regions of said substrate;

a pair of thick insulating layers overlaying and covering only said pair of associated bit lines, the portion of the surface of said substrate lying between said pair of thick insulating layers defined as the channel region of a single transistor;

a charge trapping layer formed on said channel regions and said thick insulating layers for a plurality of memory cells, said charge trapping layer being substantially thinner above said substrate than said thick insulating layer is above said substrate, said charge trapping layer comprising a thin silicon nitride layer sandwiched between two thin layers of silicon oxide;

a plurality of straight parallel edge word lines extending across said substrate in a second direction and crossing over said associated bit lines and transistor channel regions, each of said word lines having both edges straight and parallel and being separated from said substrate by said charge trapping layer and said thick insulating layer above said associated bit lines and being separated from said transistor channel regions by said charge trapping layer, said plurality of word lines comprising a conductive material, and the pair of associated bit lines and the single associated word line for each of the memory cells are arranged to receive a set of potentials for drawing collected free electrons out of the nitride layer near one of the associated bit lines to recombine in the channel region.

10. An electrically programmable read-only memory device having an array of single transistor memory cells wherein each of said cells is read, programmed, and erased through a pair of bit lines and a single word line, the memory device comprising:

a semiconductor substrate;

each memory cell including:

a pair of associated bit lines extending in a first direction across said substrate, said pair of associated bit lines comprising doped conductive regions of said substrate;

a pair of thick insulating layers overlaying and covering only said pair of associated bit lines, the portion of the surface of said substrate lying between said pair of thick insulating layers defined as the channel region of a single transistor;

a charge trapping layer formed on said channel regions and said thick insulating layers for a plurality of memory cells, said charge trapping layer being substantially thinner above said substrate than said thick insulating layer, said charge trapping layer comprising a thick silicon nitride layer sandwiched between two thin layers of silicon oxide;

a plurality of word lines extending across said substrate in a second direction and crossing over said associated bit lines, each of said word lines being separated from said substrate by said charge trapping layer and said thick insulating layer above said associated bit lines and being separated from said transistor channel regions by said charge trapping layer, said plurality of word lines comprising a conductive material; and the pair of associated bit lines and the single word line for each of the memory cells are arranged to receive a set of potentials for creating in the channel region, near one of the associated bit lines, free electrons that are attracted toward and are collected within the silicon nitride layer only near the one of the associated bit lines.

11. An electrically programmable read-only memory device, in accordance with claim 10, wherein the pair of associated bit lines and the single word line for each of the memory cells are arranged to receive a set of potentials for drawing the collected free electrons out of the silicon nitride layer near the one of the associated bit lines to recombine in the channel region.

12. An electrically programmable read-only memory device having an array of single transistor memory cells wherein each of said cells is read, programmed, and erased through a pair of bit lines and a single word line, the memory device comprising:

a semiconductor substrate;

each memory cell including:

a pair of associated bit lines extending in a first direction across said substrate, said pair of associated bit lines comprising doped conductive regions of said substrate;

a pair of thick insulating layers overlaying and covering only said pair of associated bit lines, the portion of the surface of said substrate lying between said pair of thick insulating layers defined as the channel region of a single transistor;

a charge trapping layer formed on said channel regions and said thick insulating layers for a plurality of memory cells, said charge trapping layer being substantially thinner above said substrate than said thick insulating layer, said charge trapping layer comprising a thick silicon nitride layer sandwiched between two thin layers of silicon oxide;

a plurality of word lines extending across said substrate in a second direction and crossing over said associated bit lines, each of said word lines being separated from said substrate by said charge trapping layer and said thick insulating layer above said associated bit lines and being separated from said transistor channel regions by said charge trapping layer, said plurality of word lines comprising a conductive material; and the pair of associated bit lines and the single word line for each of the memory cells are arranged to receive a set of potentials for drawing collected free electrons out of the silicon nitride layer near one of the associated bit lines to recombine in the channel region.

* * * * *